United States Patent [19]
Redfield

[11] Patent Number: 5,519,651
[45] Date of Patent: May 21, 1996

[54] HIGH CAPACITY HOLOGRAPHIC STORAGE SYSTEM

[75] Inventor: Stephen R. Redfield, Austin, Tex.

[73] Assignee: Tamarack Storage Devices, Austin, Tex.

[21] Appl. No.: 133,504

[22] Filed: Oct. 7, 1993

[51] Int. Cl.$^6$ .................................. G11C 13/04
[52] U.S. Cl. ............... 365/125; 365/112; 365/216; 369/103; 369/112; 359/22; 359/29; 359/30
[58] Field of Search .................. 365/216, 125, 365/112, 215, 234, 64; 369/103, 112; 359/22, 24, 25, 29, 30

[56] References Cited

U.S. PATENT DOCUMENTS

| | | | |
|---|---|---|---|
| 3,407,405 | 10/1968 | Hoadley | 346/108 |
| 3,408,656 | 10/1968 | Lamberts | 346/1 |
| 3,635,538 | 1/1972 | Caulfield et al. | 350/3.5 |
| 4,032,340 | 6/1977 | Bloom et al. | 96/27 H |
| 4,213,193 | 7/1980 | Reid et al. | 365/125 |
| 4,307,165 | 12/1981 | Blazey et al. | 430/8 |
| 4,334,007 | 6/1982 | Tinet et al. | 430/270 |
| 4,362,806 | 12/1982 | Whitmore | 430/202 |
| 4,458,345 | 7/1984 | Bjorklund et al. | 369/103 |
| 4,636,027 | 1/1987 | Dube | 350/3.6 |
| 4,687,720 | 8/1987 | Wreede et al. | 430/2 |
| 4,799,746 | 1/1989 | Wreede | 350/3.6 |
| 4,839,250 | 6/1989 | Cowan | 430/1 |
| 4,860,253 | 8/1989 | Owechko et al. | 365/125 |
| 4,983,003 | 1/1991 | Wreede et al. | 350/3.61 |
| 5,007,690 | 4/1991 | Chern et al. | 350/3.68 |
| 5,095,375 | 3/1992 | Bolt | 359/1 |
| 5,319,629 | 6/1994 | Henshaw et al. | 365/125 X |
| 5,339,305 | 8/1994 | Curtis et al. | 365/125 X |

*Primary Examiner*—Do Hyun Yoo
*Attorney, Agent, or Firm*—Gregory M. Howison

[57] ABSTRACT

A holographic storage assembly is provided which utilizes a large holographic storage media (36) disposed between two reflecting surfaces (40) and (42). An optics system (44) is disposed between the two reflecting surfaces (40) and (42) is operable to generate both a reference beam (58) and a data beam (50). The data beam (50) and reference beam (58) are generated on a virtual spot plane (100), which is then imaged from the surface of the reflecting surface (42) onto the much larger surface of the media (36). This is operable to record an interference grating at a storage location (56). During a playback operation, a reconstructed data beam (64) is generated and reflected from the surface of the mirror (40) onto a detector (68) in the deflector system (44).

7 Claims, 6 Drawing Sheets

HIGH CAPACITY HOLOGRAPHIC STORAGE SYSTEM

CROSS REFERENCE TO RELATED APPLICATIONS

This Application is related to U.S. Pat. No. 5,377,176, issued Dec. 27, 1994, and entitled Method and Apparatus for Isolating Data Storage Regions in a Thick Holographic Storage Media (Atty. Dkt. No. TAMA-21,889), U.S. patent application No. 08/091,620, filed Jul. 14, 1993, and entitled Method and Apparatus for Isolating Data Storage Regions in a Thin Holographic Storage Media (Atty. Dkt. No. TAMA-21,817), now U.S. Pat. No. 8,477,347, and U.S. patent application No. 08/110,139, filed Aug. 20, 1993, and entitled Method and Apparatus for Phase Encoding Data Storage Regions in a Thin Holographic Storage Media (Atty. Dkt. No. TAMA-21,875), now abandoned.

TECHNICAL FIELD OF THE INVENTION

The present invention pertains in general to data storage systems, and more particularly, to a data storage system for storing data in a holographic storage media.

BACKGROUND OF THE INVENTION

As the need for increased storage changes, the search for higher density, faster access memory technologies also increases. One of these, holographic data storage, provides the promise for increased access to higher density data. The techniques for realizing such storage typically utilize some type of storage media, such as photorefractive crystals or photopolymer layers, to store 3-D stacks of data in the form of pages of data. Typically, coherent light beams from lasers are utilized to perform the addressing, writing and reading of the data from the storage media by directing these beams at a specific region on the surface of the media. Writing is achieved by remembering the interference pattern formed by these beams at this region. Reading is achieved by detecting a reconstructed light beam as it exits the storage medium, the data then being extracted therefrom. Addressing is achieved by the positioning of the laser beams, and this is typically done through the mechanical movement of mirrors or lenses; however, the storage media itself can be moved relative to fixed laser beams.

One of the limiting aspects to the density of data stored in the storage media is the hardware complexity associated with the optics necessary for storing the number of pages in a given storage area within the holographic storage media, and therefore cost. Additionally, as the surface of the holographic media increases, both the size of the individual lenses utilized in the optics and the spacing therebetween will also increase. Both the complexity of the optics and the size of the various lenses required for large surface holographic media significantly increase cost. Typically, this is due to the fact that conventional optics systems that have been proposed for use with holographic storage media require various lenses to expand, collimate and deflect light beams. If one desired a holographic media with a surface as large as, for example, one meter, this could require lenses with diameters greater than one meter, given achievable F-numbers, and with spacings between two lenses that could exceed two to four meters. The overall train of optics could therefore extend over six meters. This, of course, is the precise problem that has confronted optics manufacturers in the field of astronomy. To solve these problems, they have resorted to spherical mirrors for collecting light and redirecting it to a viewing lens. However, these techniques have not been applied to holographic storage techniques.

SUMMARY OF THE INVENTION

The present invention disclosed and claimed herein comprises a holographic storage system for storing information. The storage system includes a holographic storage media having two substantially parallel surfaces and a plurality of storage regions. Each of the storage regions is operable to store a plurality of separately addressable pages of holographic data images. The holographic storage media is disposed on one side of a first reflective surface having a predetermined curvature. An optics system is disposed on the same side of the first reflecting surface as the storage media and is operable to direct a reference beam from the first reflecting surface to a select one of the storage regions on the storage media. The optics system has associated therewith a laser for generating a coherent light beam and a reference beam deflecting system for directing the laser beam to the first reflective surface for reflection therefrom to a select one of the plurality of storage regions. An addressing device imparts addressing information in the form of relative phase information to the reference beam associated with a select one of the stored data images in the select storage region to allow reconstruction thereof as a reconstructed data beam when the reference beam illuminates the select storage region. A detector is operable to receive the reconstructed data beam and detect the data therein.

In another aspect of the present invention, a second reflective surface is provided and disposed on the opposite side of the storage media from the first reflective surface. The detecting device comprises a photodetector that is disposed on the opposite side of the storage media from the optics system. The reconstructed data beam is operable to be directed downward to the second reflective surface, and be reflected therefrom to the photodetector. The photodetector has a detection surface that is disposed relative to the second reflecting surface such that it will receive the reconstructed data beam from any of the storage locations.

In yet another aspect of the present invention, the optics system includes a beam splitter for splitting off a portion of the laser beam as a data beam. A spatial light modulator then superimposes a data image onto the data beam. The data beam is then directed by a data beam deflecting system toward the first reflecting surface for reflection therefrom to the select location on the surface of the holographic storage media. The data beam deflecting system and the first reflective surface perform a Fourier transform on the data image superimposed on the data beam. At this select location or stack site it is made to interfere with the previously mentioned reference beam.

In a further aspect of the present invention, the data deflecting system includes a focusing lens for receiving the data beam after the data image is superimposed thereon and a focal spot plane. A directing system is operable to direct the output of the focusing lens through a select location on the focal spot plane such that the focal point for the focusing lens is substantially coplanar with the focal spot plane for all positions of the directing system. The focal spot plane is disposed relative to the first reflective surface such that it will be imaged onto the storage media and, therefore, the data beam that is directed through the select location will be focused onto a corresponding storage region on the surface of the storage media.

In a yet further aspect of the present invention, each of the data images in a given one of the storage regions is encoded by a page encoding device such that a reference beam encoded with relative phase information corresponding to one of the data images and being at a predetermined angle will generate a reconstructed data beam for that and only that stored data image. The page encoding device includes a beam expander for expanding the light beam and a phase corrugator for imparting relative phase information to select portions of the expanded light beam to provide a phase encoded light beam. The phase encoded light beam is then directed by a deflecting system to reflect from the first reflective surface such that all of the phase encoded portions of the phase encoded light beam intersect at a common point on the surface of the storage media within the select storage region.

BRIEF DESCRIPTION OF THE DRAWINGS

For a more complete understanding of the present invention and the advantages thereof, reference is now made to the following description taken in conjunction with the accompanying Drawings in which.

DETAILED DESCRIPTION OF THE INVENTION

Figure 1:
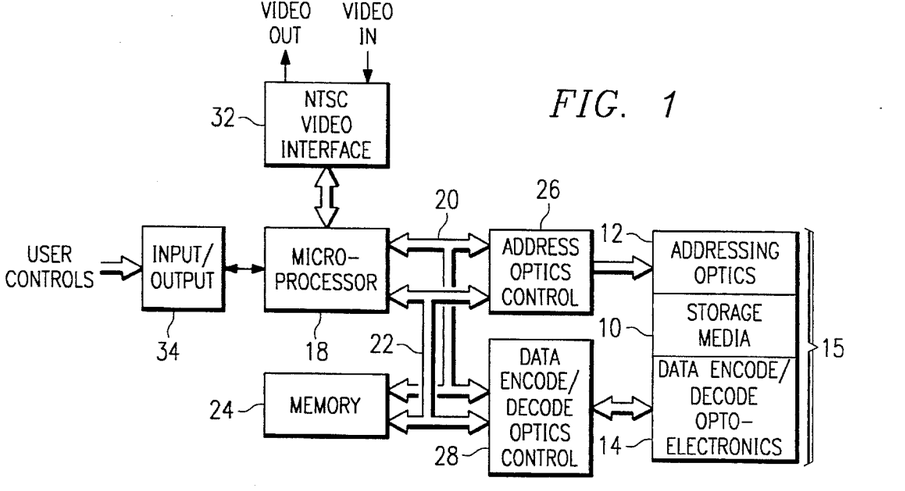
FIG. 1 illustrates a block diagram of the holographic storage system of the present invention.

Referring now to FIG. 1, there is illustrated a block diagram of the components of the holographic storage system. The holographic storage system has associated therewith a holographic storage media 10, which holographic storage media 10 is a high capacity optical storage media that is operable to store data at a capacity on the order of 900 Giga Bytes. In the preferred embodiment, this is comprised of an $LiNbO_3$ photorefractive crystal, with the storage media 10 being comprised of a plurality of files of these photorefractive crystals, each of the photorefractive crystals being in the from of a slab. This use of photorefractive crystals is described in U.S. Pat. No. 4,927,220, issued May 22, 1990 and entitled, System and Method for Photorefractive Holographic Recording and Signal Processing, which patent is incorporated herein by reference.

The storage media 10 has associated therewith addressing optics 12 and data encode/decode opto-electronics 14. The addressing optics 12, storage media 10 and data encode/decode opto-electronics 14 comprise a storage assembly 15. The addressing optics 12, as will be described hereinbelow, are operable to direct a reference beam to a specific location on the surface of the storage media 10 for a recording operation and for a data retrieval operation, and to direct a data beam after it is reflected off an SLM to the same specific location on the surface of the storage media 10 for a recording operation. The data encode/decode opto-electronics 14 is operable during a record operation to impose a data pattern on the data beam. During a data retrieval operation, a reconstructed data beam is output by the storage media 10 and this is detected and the data extracted therefrom.

The system of FIG. 1 is controlled by a microprocessor 18, which is a conventional microprocessor used in most conventional operations. The microprocessor 18 has associated therewith an address bus 20 and a data bus 22 for carrying address and data information, respectively. Additionally, the address bus 20 is operable to carry control signals. The microprocessor 18 is interfaced through the address and data buses to a conventional memory 24 that is typically utilized for storing operating instructions for the system. This is typically in the form of non-volatile memory or volatile memory. The address bus 20 and data bus 22 are also interfaced with an address optics control system 26 and a data encode/decode opto-electronics control system 28. The address optics control system 26 is operable to interface with the addressing optics 12 to control the direction of the reference beam to a specific location on the surface of the storage media 10 and also to provide for phase encoding thereof. The address optics control system is also operable to interface with the addressing optics to control the direction of the data beam to the same specific location on the surface of the storage media 10. As will be described hereinbelow, a phase encoding scheme is utilized on each storage location such that multiple images of data patterns can be stored at each location, each of these images referred to as a page and the group of pages in a storage location referred to as a stack. The data encode/decode opto-electronics control is operable to, during a record operation, encode data into a particular format which includes ECC and other redundant information to aid in data recovery during the readout. During a data retrieval operation, the encode/decode opto-electronics control system 28 is operable to decode the reconstructed image.

In one application of this system, the microprocessor 18 is operable to interface with external NTSC video through an NTSC video interface 32. The interface 32 is operable to receive NTSC video and output NTSC video. Typically, the NTSC video interface will receive the NTSC video, decode various timing clocks therefrom, separate it into the various components and digitize these components. These are conventional interfaces. An input/output device 34 is provided for allowing the user to input controls to the microprocessor 18. In operation, the microprocessor 18 is operable to receive video in the form of an NTSC video stream, which basically comprises a series of pixels, each pixel comprising a picture element on the screen which is represented by a digital word. This digital word is then placed into a digital data stream and input to the storage media 10. Typically, the addressing optics is operable to store the digital words representing each pixel in a sequential manner in the storage media 10 such that adjacent pages of information in a given storage location on the surface of the storage media 10 correspond to adjacent pixels in the digital stream, and adjacent storage regions also correspond to adjacent groups of pixels in the digital data stream.

During a playback operation, it is only necessary to logically sequence through all of the adjacent pages in a given storage region, and then sequence to the next adjacent storage region and sequence through the pages therein. This allows the system of FIG. 1 to be applied to a video program operation. However, it should be understood that the addressing optics 12 and the data encode/decode optics 14 can randomly access data in a conventional manner. The storage media 10 is a media that can only be written to once and, as such, it is referred to as a Write Once Read Many (WORM) media.

Figures 2, 2A:
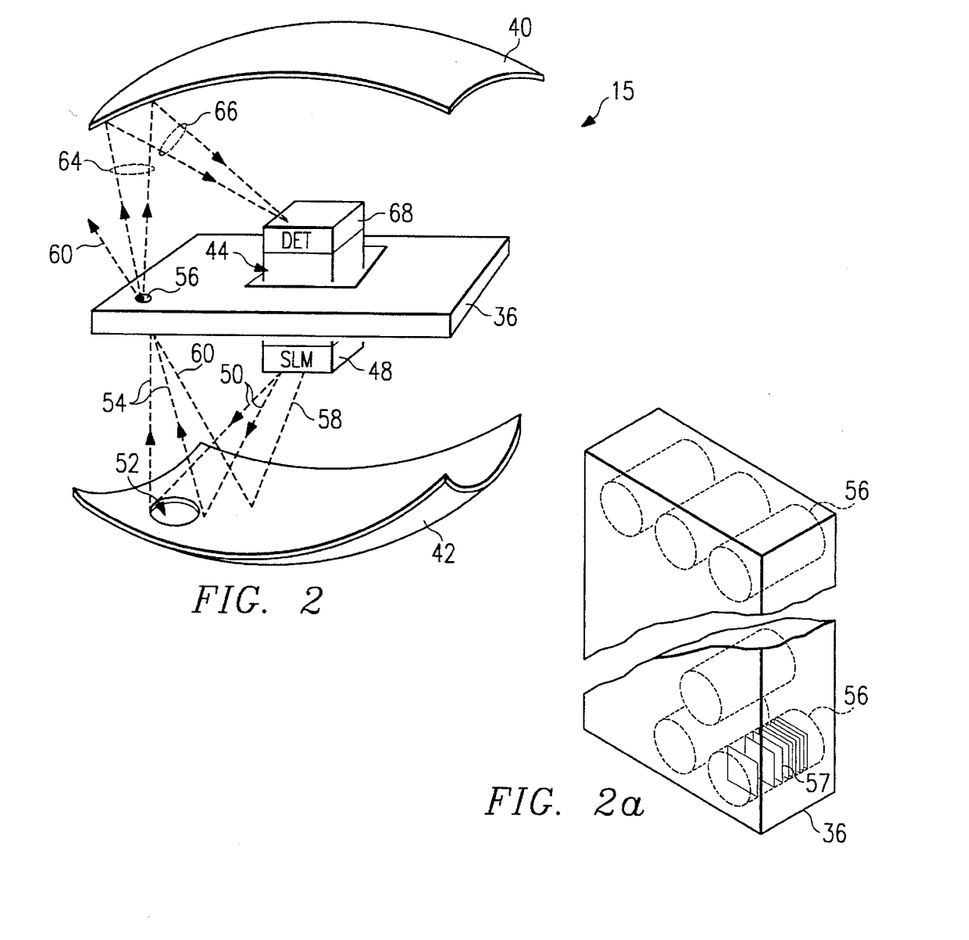
FIG. 2 illustrates a detail of the storage media and the addressing and data encode/decode optics.
FIG. 2a illustrates a detail of the storage media and the storage locations therein.

Referring now to FIG. 2, there is illustrated a diagrammatic view of the layout of the storage assembly 15. The storage media is comprised of a plurality of media slabs disposed in a two-dimensional surface 36 that is disposed between a first reflective surface 40 and a second reflective surface 42. Reflective surfaces 40 and 42 providing the addressing optics function, as will be described hereinbelow. The deflection optics are provided in a deflection system 44, which is disposed between the two reflective surfaces 40 and 42 and, in the embodiment illustrated in FIG. 2, within the center of the media 36. At one end of the deflection system 44 there is disposed a Spatial Light Modulator (SLM) 48, which is operable to encode data on a data beam 50. The data beam 50 is expanded and directed toward the surface of the second reflective surface 42 at a spot 52. This results in a redirected data beam 54, which is directed toward a location 56 on the surface of the media 36. The deflection system 44 is also operable to generate the reference beam 58 which is directed toward the surface of the reflective surface 42 and is redirected as a redirected reference beam 60 to illuminate the storage region 56.

During a record operation, operation of the data beam 50 and the reference beam 58 result in the storage of an interference grating within the storage region 56. During a data retrieval operation, the data beam 50 is not generated and only a reference beam 58 is generated, such that the redirected reference beam 60 illuminates the storage region 56. If any previously recorded data in the form of an interference grating is present in the storage region 56 and is addressed by the reference beam, a reconstructed data beam 64 will be generated, which is directed along the same line as a redirected data beam 54. As will be described hereinbelow, the addressing function within a given storage location is accomplished by phase encoding the reference beam, with each page of information in the storage location having a unique phase code associated therewith. After generation thereof, the reconstructed data beam 64 is directed to the reflective surface of the reflecting surface 40 and reflected therefrom as a redirected reconstructed data beam 66. This redirected reconstructed data beam 66 is directed toward the deflection system 44 on the opposite side of the media 36 from the SLM 48 to a detector 68.

As will be described in more detail hereinbelow, the addressing optics 12 operates such that there is a virtual spot plane formed just in front of the lower surface of the deflecting system 44 at the SLM 48, which virtual spot image plane is then magnified and imaged onto the surface of the media 36 at a specific location.

Referring now to FIG. 2a, there is illustrated a detail of the media 36. The media 36, as described above, is an $LiNbO_3$ photorefractive crystal having a plurality of pages of information 57 stored therein the form of a stack. In FIG. 2a, these stacks are illustrated as pages of information, which are stored one over the other. However, each of the pages in actuality occupies the same area. As will be described hereinbelow, each of the pages of information in the stack of pages 57 are discriminated by a phase encoding technique. Each of the storage locations 56 are separated by a predetermined distance, which is arbitrarily determined. Although the storage regions 56 can be physically isolated, they typically occupy an entire photorefractive crystal with the only separation being a spatial separation.

Figure 3:
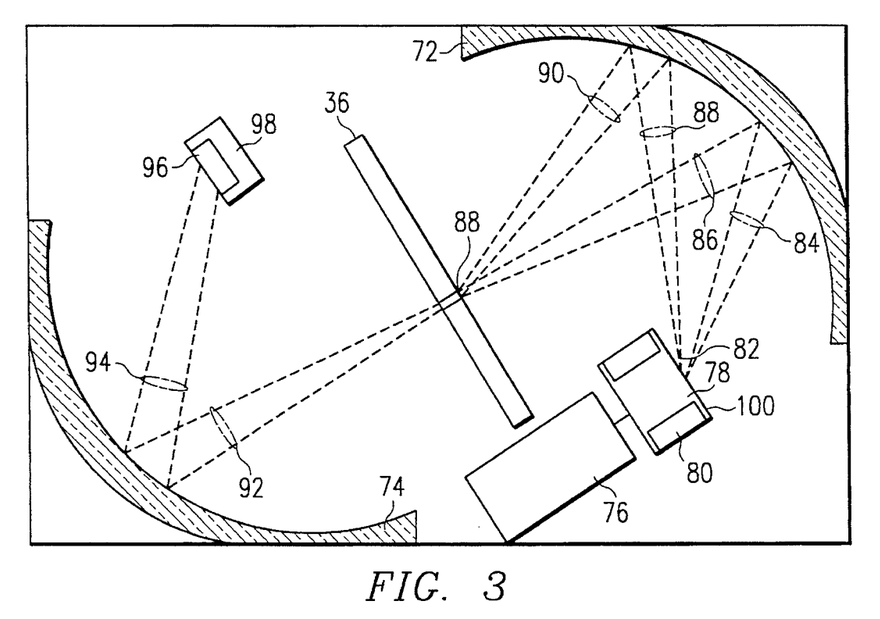
FIG. 3 illustrates a top view of one embodiment of the general layout of the present invention with the addressing optics and the data encode/decode optics.

Referring now to FIG. 3, there is illustrated a top view of the layout of one embodiment of the present invention. The storage media 36 is disposed between a front focusing mirror 72 and a rear focusing mirror 74. Each of the focusing mirrors 72 and 74 are substantially spherical surfaces on the surface thereof facing the media 36, although they may not be perfectly spherical. It is desirable to have the reflective surfaces of the front focusing mirror 72 and the rear focusing mirror 74 being aspherical and parabolic in nature for the purpose of preventing distortions, as will be described hereinbelow. However, for the purposes of discussion, it will be assumed that the reflecting surfaces of the mirrors 72 and 74 are substantially spherical.

Figure 4:
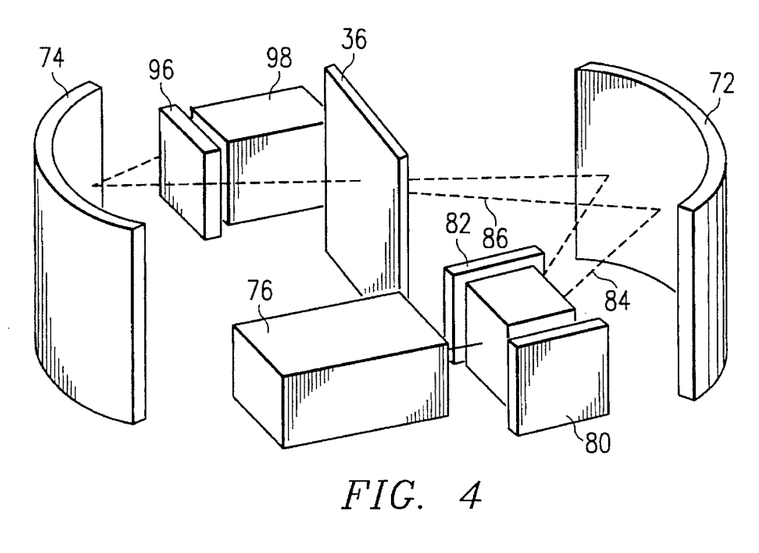
FIG. 4 illustrates a perspective view of the system of FIG. 3.

The mirrors 72 and 74 are slightly tilted with respect to the surface of the media 36, such that the deflection assembly can be disposed to one side of the media 36 and the detector assembly can be disposed to the other side. A laser 76 is disposed on one side of the media 36 that is comprised of a diode-pump YAG (Yttrium Aluminum Garnet) laser with a power output of around 100 milliwatts, with a wavelength in the range of 532 nanometers. The laser 76 is directed toward a deflection assembly 78, which has associated therewith an SLM 80 and a phase corrugator 82. The SLM 80 is utilized to generate a data beam 84 which is reflected from the surface of the mirror 72 as a redirected data beam 86 to a specific storage location 89 on the surface of the media 36. As will be described hereinbelow, the mirror 72 provides a portion of the Fourier transform operation on the data. Additionally, the phase corrugator 82 is operable to superimpose a phase pattern onto a reference beam 88 and reflect the reference beam 88 from the surface of the mirror 72 as a redirected reference beam 90 and direct it to the storage location 89. As will be described hereinbelow, the phase encoding operation of the reference beam requires it to be expanded, segmented, have the segments phase encoded and then redirect the segments to the storage location 89. The mirror 72 provides the redirection of the segments to the storage location 89. During a data reconstruction operation, only the reference beam 88 is generated. When data is recorded at the storage location 89, a reconstructed data beam 92 will be directed toward the reflective surface of the mirror 74 and redirected as a redirected beam 94 to a detector array 96, which is disposed on the opposite side of the media 36 from the laser 76 and the deflection assembly 78. Further, the detector array 96 has electronics 98 associated therewith for both performing the detection operation and outputting the detected data. A perspective view of this is illustrated in FIG. 4.

The deflection assembly 78 provides a virtual spot plane 100 just in front of the deflection assembly, which virtual spot plane 100 is imaged by the mirror 72 onto the surface of the media 36. By disposing the virtual image spot plane 100 in front of the focal plane of the mirror 72 and the media 36 behind the focal plane, this allows the virtual spot plane 100 to be magnified to coincide with the surface of the media 36, such that a virtual image spot plane of approximately 8×4 cm can be imaged to a much larger media 36 on the order of 32×16 centimeters. In a similar manner, the SLM is imaged onto the surface of the detector array 96 through each storage location on the surface of the media 36 (this not constituting a virtual spot plane).

Figure 5:
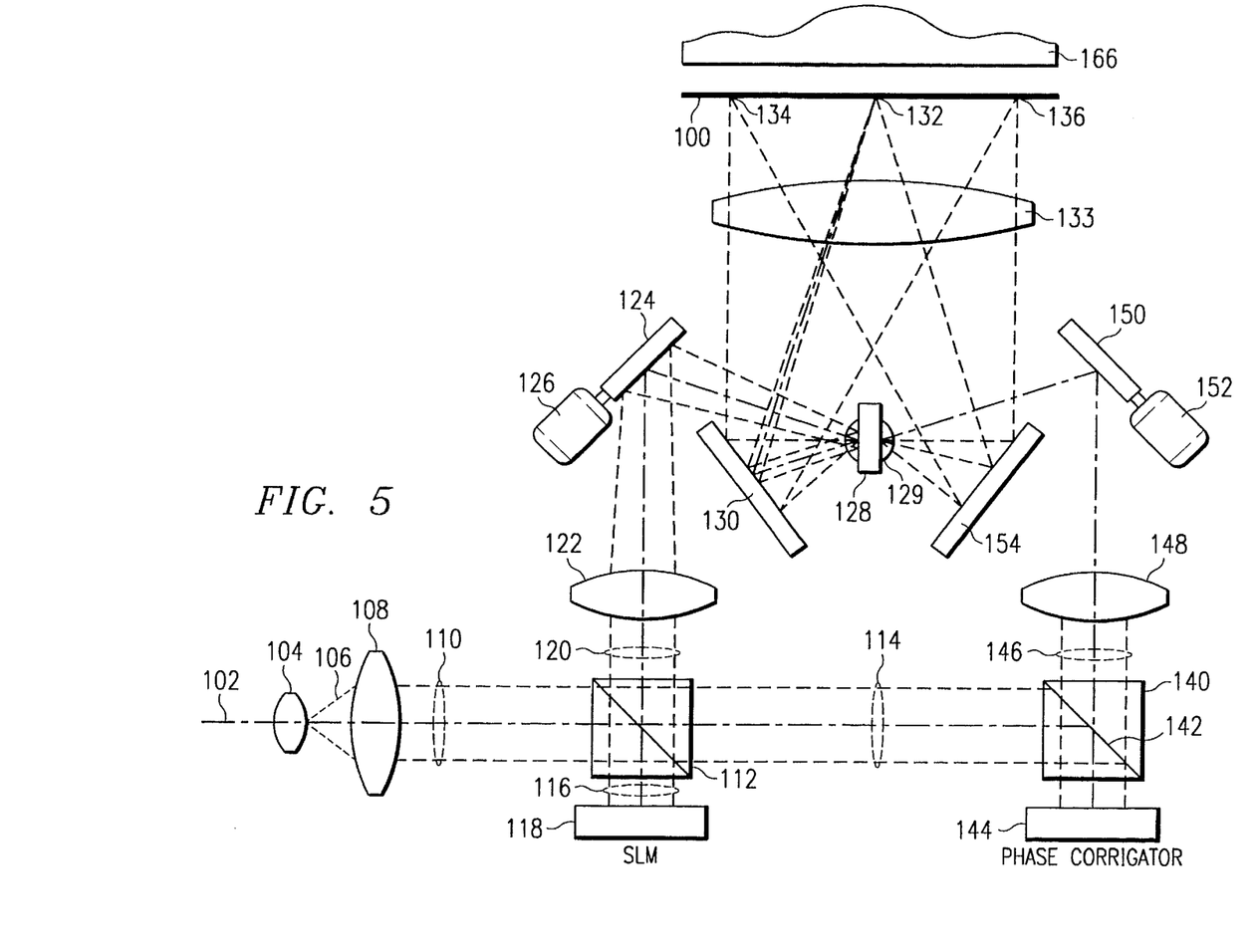
FIG. 5 illustrates a detailed diagram of one embodiment of the deflection assembly for directing both the reference and the data beams.

Referring now to FIG. 5, there is illustrated a detail of the deflection assembly 78. The laser 76 is operable to output a coherent light beam 102 into the deflection assembly 78, which is directed toward a first expanding lens 104 which is operable to expand the beam 102 into the expanded beam 106, which is directed toward a collimating lens 108. The collimating lens 108 is operable to output an expanded and collimated light beam 110. As described hereinbelow, this is utilized for both the data beam and the reference beam. The light beam 110 is directed toward a beam splitter 112 which is operable to direct a portion therefrom as a reference beam 114 and a portion therefrom as a data beam 116 toward SLM 118. The light beam directed toward the SLM 118 is reflected therefrom in the predetermined pattern. The SLM 118 is typically an array of small elements, such as LCDs, which either rotate the polarization of the light or pass the original polarization through. If they rotate the polarization, light passes back through the beam splitter 112 as beam 120. If they are not rotated, light is blocked. The beam splitter 112 is operable to allow the polarized and reflected light from the SLM 118 to pass therethrough as a data beam 120 with the data pattern associated therewith. The data pattern is essentially a grid of squares, each square comprising a bit of information. One logic state comprises a dark image and one logic state comprises a light image, such that a binary image is provided.

The data beam 120 is directed toward a focusing lens 122, which, as will be described hereinbelow, is the Fourier transform lens. This is then directed toward a Y1 stepper mirror 124, which is controlled by a stepper motor 126 to rotate about an axis in the plane of the page. The mirror 124 reflects the beam onto the surface of an X stepper mirror 128, which is controlled by an X stepper motor 129, the axis of rotation extending outward from the page. The beam 120, after being focused by the lens 122, impinges upon the axis of rotation of the mirror 124 and is reflected to the axis of rotation of the mirror 128. The beam is reflected off of the X stepper mirror 128 to a fixed mirror 130, disposed at an angle to the X stepper mirror 128. The mirror 130 reflects the beam to a spot 132 in the virtual spot plane 100 through a lens 133. The beam reflected off of the mirror 124 can be controlled by the mirror 124 to traverse the plane of the mirror 130 into the plane of the paper. This provides one dimension of movement. When the X stepper mirror 128 is rotated by the motor 129, the beam will move in the plane of the paper on the surface of the mirror 130, there being illustrated a spot 134 at one extreme and a spot 136 at the other extreme disposed about the spot 132. Therefore, the distance between the spots 134 and 136 comprises the virtual image of the media 36, this image then being imaged onto the surface of the media 36 by the front focusing mirror 72, as described above.

The reference beam 114, after passing through the beam splitter 112, is directed toward a polarizing optical device 140. The beam 114 has a predisposed polarization which, when impinging upon the polarizing device 140 is reflected from a surface 142 downward onto a phase corrugator 144. The phase corrugator 144 is a reflective device that is operable to reflect the reference beam back toward the surface 142 with various portions of the reference beam having different phases imparted thereto. It also rotates the polarization of the light by ninety degrees. However, the relative phase of all of the portions or segments are such that they will now pass through the surface 142, since they will have the appropriate polarization. This will result in a phase encoded reference beam 146, which is then input to a focusing lens 148. Focusing lens 148 is operable to redirect the segments, focusing them downward onto the surface of a Y2 stepper mirror 150, which is controlled by a Y2 stepper motor 152 to rotate along an axis of rotation in the plane of the page, the phase encoded reference beam 146 focused onto the axis of rotation. This beam is then directed to the opposite surface of the X stepper mirror 128 and is reflected therefrom toward a second fixed mirror 154 and reflected therefrom to the spot 132. The fixed mirror 154 is oriented with respect to the fixed mirror 130 such that it is at an angle with respect thereto. Therefore, when the X stepper mirror 128 is rotated to move the data beam reflected therefrom on one surface downward on the surface of the mirror 130, it is operable to move the reflected reference beam up on the surface of the mirror 154 such that both will track along the virtual spot plane 100.

It can be seen that the focal point of the lens 122 is disposed such that the focal length is the sum of the distance from the lens 122 to the mirror 124, the distance from the mirror 124 to the mirror 128, the distance from the mirror 128 to the mirror 130 and the distance from the mirror 130 to the virtual spot plane 100. Similarly, the focal point of the lens 148 is approximately equal to the sum of the distance from the lens 148 to the mirror 150, the distance from the mirror 150 to the mirror 128, the distance from the mirror 128 to the mirror 154 and the distance from the mirror 154 to the virtual spot plane 100. Therefore, if this were the media, this would constitute the storage location and the lens 122 would provide the Fourier transform for the recording operation. However, as described above, the virtual spot plane is a relatively small dimension compared to the much larger dimension of the media 36. By utilizing this configuration, relatively small lenses can be utilized to perform the Fourier transform and the beam deflection operation for both recording and dam retrieval.

Figure 5A:
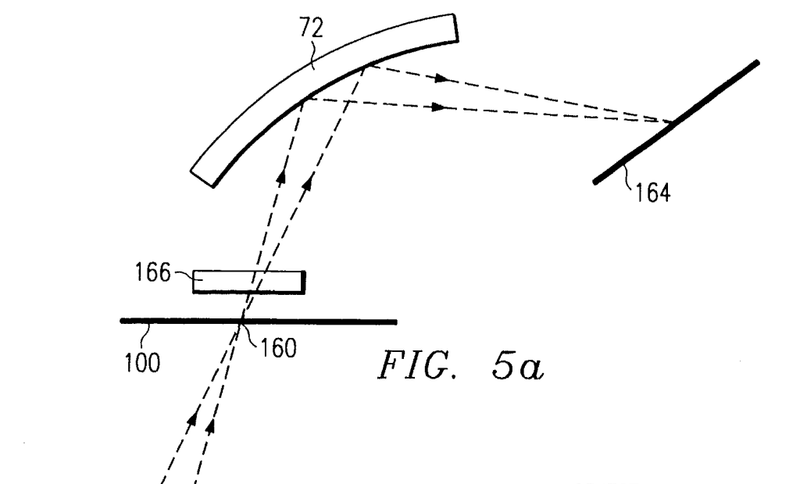
FIG. 5a illustrates a diagrammatic representation of the virtual spot plane associated with this deflection assembly.

Referring now to FIG. 5a, there is illustrated a diagrammatic view of how the imaging described above is achieved. The beam, either the data beam or the reference beam, is directed toward a spot 160 on the surface of the virtual spot plane 100. However, since they are converging, they will diverge or expand on the opposite side of the virtual spot plane and then be directed toward the interior reflected surface of the front focusing mirror 72. They will be reflected therefrom to a second image plane 164 that comprises the surface of the media 36. By disposing the virtual spot plane inside the focal length of the focusing mirror 72 and the image plane 164 a predetermined distance away from the focal point of the mirror 72, the virtual spot plane 100 can be expanded and magnified. However, there will be some aspherical aberrations due to the surface 72 being spherical. This will result in some distortion. This can be accommodated by designing the lens surface 72 to be an aspherical surface, which is a relatively complex task. The distortion can be alleviated by utilizing an optical device 166 to provide some aspherical corrections. This is referred to as a field flattener that essentially flattens the focal point to provide a flat surface. Therefore, this will alleviate any distortion due to the use of a spherical surface for the front focusing mirror 72.

Figure 5B:
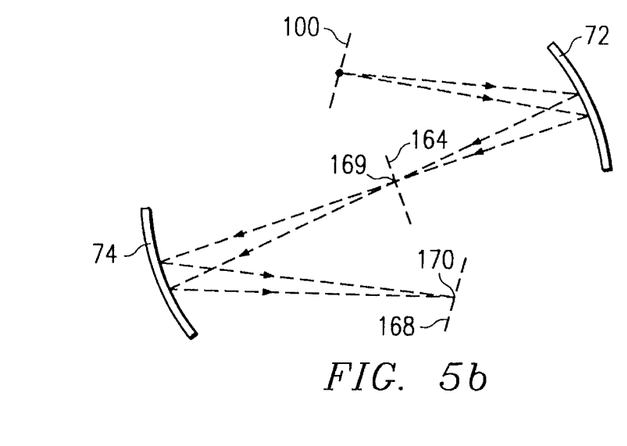
FIG. 5b illustrates a diagrammatic view of the modified schlieren arrangement of the primary reflecting surfaces of the optics utilized in the present invention to prevent distortion.

Referring now to FIG. 5b, there is illustrated a diagrammatic view of the path of the dam beam from the virtual spot plane 100 to an image plane 168 behind the detector 96. The spot on the virtual spot plane 100 is referred to as the object which is an expanding beam that is directed toward the reflecting surface of a mirror 72 and onto the image plane 164 at a spot 168. This constitutes the surface of the media 36. However, upon data reconstruction, the data beam will be continued and directed toward the reflecting surface of the mirror 74 as an expanding beam and then reflected therefrom to a spot 170 on the image plane 168. This is a modified schlieren system.

Figure 6:
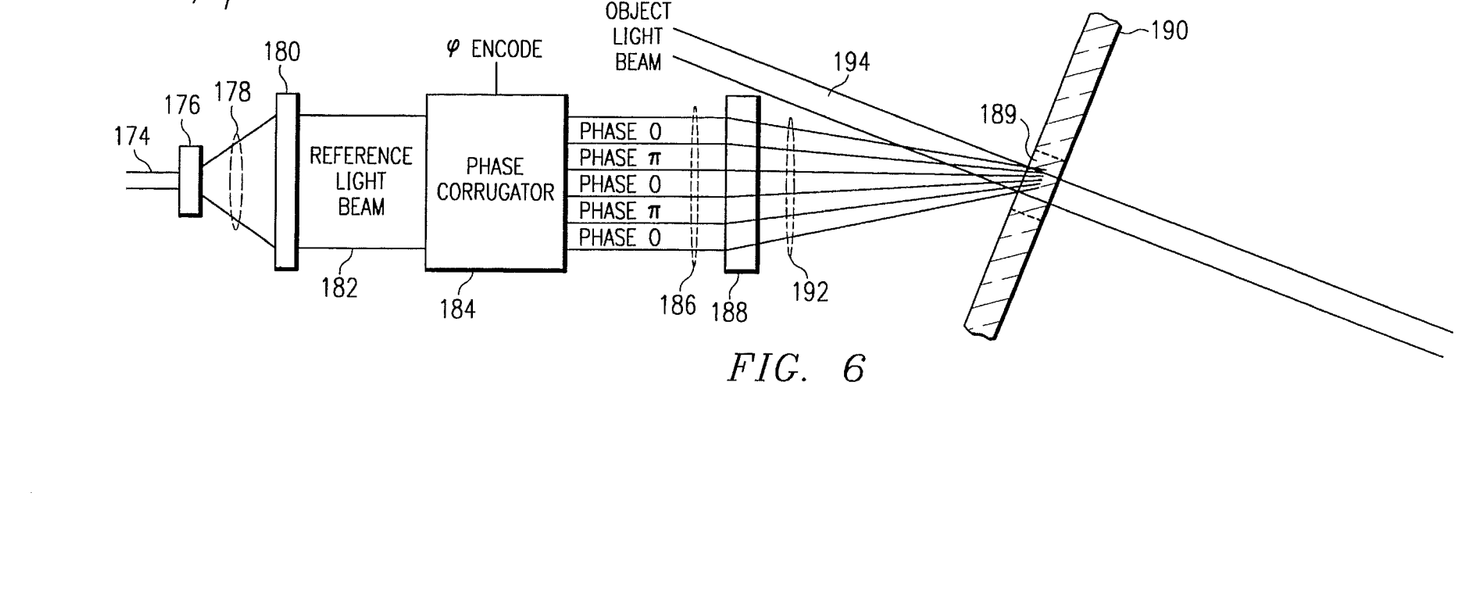
FIG. 6 illustrates a simplified view of one embodiment of the phase multiplexing system for the reference beam.
Figure 7:
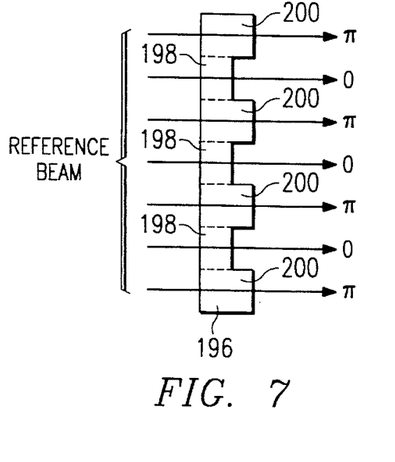
FIG. 7 illustrates a detail of one embodiment of the phase corrugator.

Referring now to FIG. 6, there is illustrated a diagrammatic view of a simplified embodiment of the phase encoding operation utilizing the phase corrugator, the simplified description referring to a transmissive phase corrugator. In the example of FIG. 6, a light beam 174 is first expanded by passing it through a beam expander lens system 176 to provide an expanded light beam 178 which is then collimated by a lens 180 to provide the expanded reference light beam 182. The reference light beam 182 then passed through a phase corrugator 184 to effectively partition the light into segments and then apply a particular phase shift to a subset of the segments. In the embodiment illustrated in FIG. 6, the phases of the segments are either zero or "$\pi$" relative to each other. As described hereinbelow, it is necessary to have the phases at either zero or $\pi$. This is referred to as a phase corrugated light beam 186. The phase corrugated light beam 186 is then passed through a focusing system 188 to focus the phase corrugated light beam 186 onto the same region 189 of a storage media 190 as a directed reference beam 192.

Since it is described as being transmissive, the light is illustrated as moving from one side to the other. However, in a reflective system, it is only necessary to have a phase shift for each of the thick segments 200 as $\pi/2$. Of course, the phase shift between the thin segments and the thick segments is relative and the overall phase shift is polarized in the reflective system such that it will pass through the polarizing reflective surface 142.

It can be seen that the directed reference beam 192 is focused onto the surface of the storage region 189 and passed therethrough. An object light beam 194 passes through the same region such that all interference gratings of the object light beam 194 with each of the segments in the phase segmented light beam 186 will intersect "within" the storage medium that comprises the storage region 189. To reconstruct the image, it is then only necessary to remove the object light beam 194 and pass the directed reference light beam 192 through the same location at the same angle with respect to the surface of the storage media 190 and also with the same encoded phase pattern formed on the segments in the phase segmented light beam 186.

Figure 8:
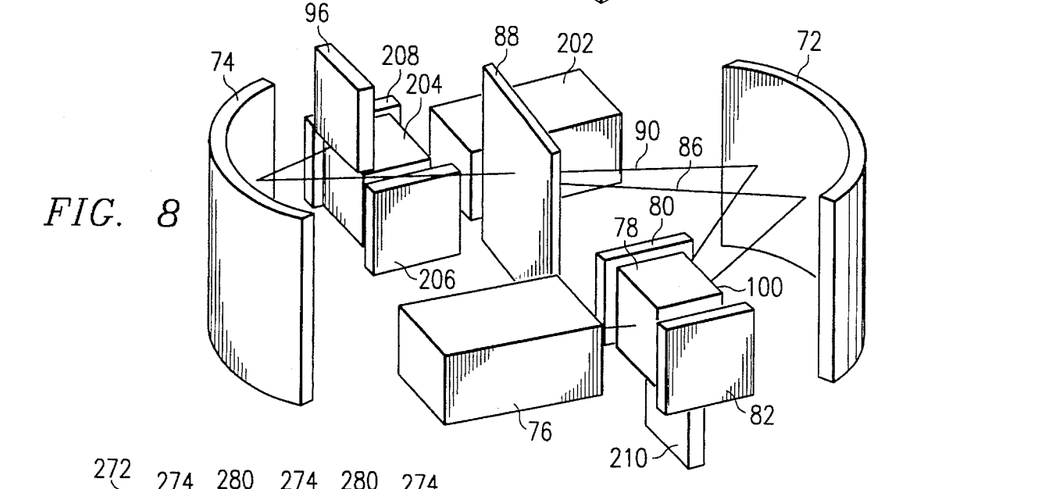
FIG. 8 illustrates an alternate embodiment of the present invention which is a dual head storage assembly.

Referring now to FIG. 8, there is illustrated an alternate embodiment of the present invention utilizing two optical assemblies for recording and/or playback operations. The first assembly is illustrated in FIG. 3 with the addition of a second assembly. A detector array 196 is located proximate to a second laser 202, which laser 202 is directed at a second deflection assembly 204 having associated therewith an SLM 206 and a phase corrugator 208. The reference and data beams output by the second deflection assembly 204 are directed toward the rear reflecting surface of the rear focusing mirror 74. Therefore, a detector array 210 is disposed proximate to the deflection assembly 78 and virtual spot plane 100. By providing two optical assemblies, an increase in the bandwidth by a factor of two is realized. The increase in bandwidth is due to the fact that the two optical assemblies can be operated in unison to access different stacks at the same time or the same stack at different times, the latter being an interlaced operation.

Figure 9:
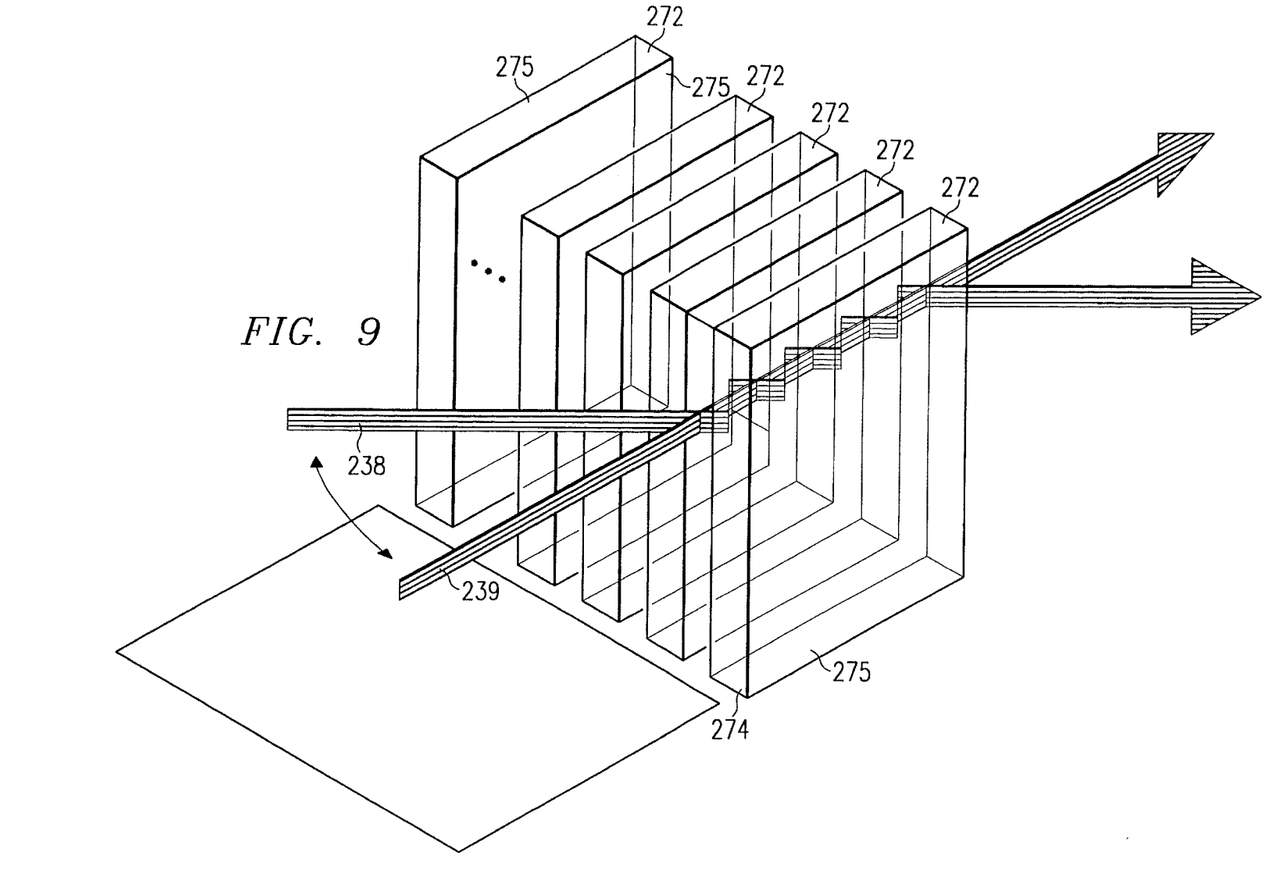
FIG. 9 illustrates an embodiment for the realization of the media which utilizes slabs of photorefractive crystal which form isolated regions.

Referring now to FIG. 9, there is illustrated a one embodiment of the media utilizing a photorefractive storage media. In general, the storage operation of photorefractive materials is described in U.S. Pat. No. 4,927,220, issued May 22, 1990 and entitled, "System and Method for Photorefractive Holographic Recording and Signal Processing", which patent is incorporated herein by reference. The media of FIG. 9 utilizes a plurality of slabs 272 of photorefractive material or thick storage media which have an incident face 274 on one edge with the incident faces 274 of all of the slabs 272 disposed in the same plane. Each slab 272 has two side faces 275 perpendicular to the incident face 272. The incident face 274 provides the incident surface for both a reference beam 238 and a data beam 239. However, it is that the reference beam 238 and the data beam 239 are disposed in a single plane that is both perpendicular to the incident surface 274 and also perpendicular to the side faces 275 of the slab 272. The slabs 272 are separated from each other by a predetermined distance and the data beam is oriented such that when the data beam 239 passes through the slab 272, it will not bleed over into an adjacent slab or even interact with the side faces 275. The angles are such that they will be internally reflected off the side faces 275. Therefore, there is a substantially total isolation between adjacent slabs. In the vertical direction within a slab, there will be some bleed, but the reference beam 238 being perpendicular to the face 275 results in little dispersion of the light in a vertical direction. This internal confinement of the reference beam by the side 275 results in a long overlap region between the data and the reference beam.

Figure 10:
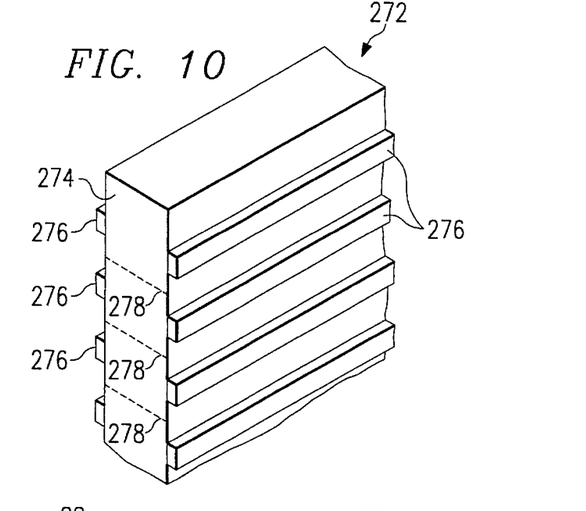
FIG. 10 illustrates a detail of the electrode structure about one of the slabs of photorefractive crystal.

Referring now to FIG. 10, there is illustrated a detail of the slab 272 of FIG. 9, illustrating a plurality of electrodes 276 disposed on the sides thereof. The electrodes 276 are required in order to enhance the recording sensitivity of select regions within a given slab, the regions being disposed in a vertical manner. These regions are defined by dotted lines 278. Each one of the regions has an electrode 276 on either side thereof disposed along the length of the region. These electrodes 276 can be disposed at the appropriate voltage to allow data to be recorded to the photorefractive crystal material or read therefrom. This is conventional. In general, the electrode 276 can be formed on the side thereof by a technique of depositing metallization thereon and then etching the metallization into a longitudinal electrode member or by attaching the electrode thereto by an adhesive process.

Figure 11:
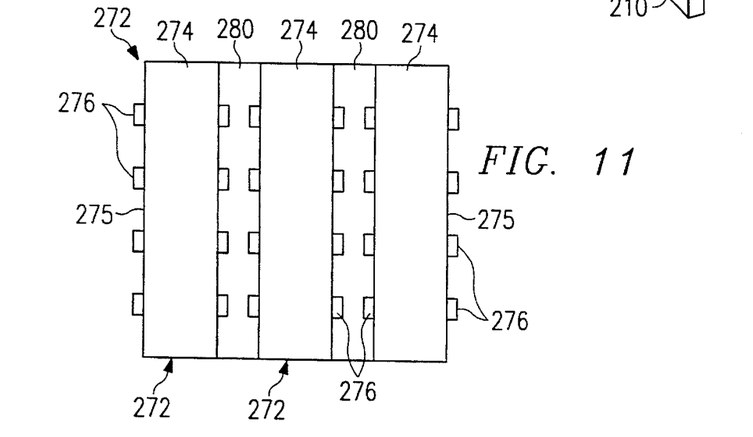
FIG. 11 illustrates a cross-sectional detail of the slab assembly with the insulating layer disposed therebetween.

Referring now to FIG. 11, there is illustrated a detailed end view of the structure of FIG. 9, illustrating an insulated layer 280 disposed between adjacent ones of the slabs 272. The insulating layer is an electrically insulating layer that provides both a separating function and also an electrical isolating function. Additionally, the thickness of the isolating layer 280 provides some separation to prevent the bleed from the laser beams entering into the incident face 274 and bleeding over into an adjacent slab. However, the internal reflection along the face 275 will allow a thicker media to be utilized. Although a photorefractive crystal is described, the structure of FIG. 9 can be utilized with any type of thick holographic storage media in which an interference grating can be stored. The photorefractive crystal allows it to be stored in a Read/Write mode.

In summary, there has been provided a complex holographic storage system for storing data in a holographic storage media. The holographic storage media is disposed between two reflecting surfaces and the optics assembly is also disposed between the two reflecting surfaces. The optics assembly is operable to generate both a reference beam and a data beam with the data beam having data encoded thereon and the reference beam having phase encoding imparted thereto. Both the reference beam and the data beam are focused onto a spot on the virtual spot plane, which virtual image plane is then imaged off the surface of one of the mirrors onto the media. The virtual spot plane is magnified substantially to correspond to a much larger surface of the media. During a record operation, the reconstructed image is reflected from the rear focusing surface onto a detector array.

Although the preferred embodiment has been described in detail, it should be understood that various changes, substitutions and alterations can be made therein without departing from the spirit and scope of the invention as defined by the appended claims.

What is claimed is:

1. A holographic storage system for storing information, comprising:

a holographic storage media having two substantially parallel surfaces, and a plurality of storage regions, each for storing a plurality of separately addressable pages of holographic stored data images;

a first reflective surface for being disposed on one side of said holographic storage media and having a predetermined curvature;

a second reflective surface for being disposed on the opposite side of said holographic storage media from said first reflective surface and having a predetermined curvature;

a first optics system disposed on the same side of said first reflective surface as said storage media, said first optics system having:

a first laser for generating a first coherent laser beam, a first reference beam deflection system for directing said first laser beam as a first reference beam to reflect from said first reflective surface to a select one of said plurality of storage regions in said storage media, a first addressing device for imparting addressing information to said first reference beam associated with a select one of said stored data images in said select storage region to allow for reconstruction thereof as a first reconstructed data beam; and a first detection system for receiving said first reconstructed data beam and detecting a data therein; and a second optics system disposed on the same side of said second reflective surface as said storage media, said second optics system having:

a second laser for generating a second coherent laser beam, a second reference beam deflection system for directing said second laser beam as a second reference beam to reflect from said second reflective surface to a select one of said plurality of storage regions in said storage media, a second addressing device for imparting addressing information to said second reference beam associated with a select one of said stored data images in said select storage region to allow for reconstruction thereof as a second reconstructed data beam; and a second detection system for receiving said second reconstructed data beam and detecting a data therein.

2. The holographic storage system of claim 1, wherein said first and second detection systems each comprise:

a photodetector having a detection surface and disposed on the opposite side of said holographic storage media from said respective first and second optics systems and in a location wherein said respective first and second reconstructed data beams from any of said storage locations will fail on said respective detection surfaces after being directed thereto by said respective second and first reflective surfaces.

3. The holographic storage system of claim 1, and further comprising:

a first beam splitter for splitting off a portion of said first laser beam as a first data beam;

a first spatial light modulator for superimposing a first data image onto said first data beam;

a first data beam deflector for directing said first data beam toward said first reflective surface for reflection therefrom to said select region to interfere with said reference beam, said first data beam deflector and said first reflective surface performing a Fourier transform on the first data image superimposed on said first data beam;

a second beam splitter for splitting off a portion of said second laser beam as a second data beam;

a second spatial light modulator for superimposing a second data image onto said second data beam; and a second data beam deflector for directing said second data beam toward said second reflective surface for reflection therefrom to said select region to interfere with said second reference beam, said second data beam deflector and said second reflective surface performing a Fourier transform on the second data image superimposed on said second data beam.

4. The holographic storage system of claim 3, wherein said first data beam deflector comprises:

a first focusing lens for receiving said first data beam after the first data image is superimposed thereon;

a first focal spot plane;

a first directing system for directing an output of said first focusing lens through select locations on said first focal spot plane such that a focal point of said first focusing lens is substantially coplanar with said first focal spot plane for all positions of said first directing system; and said first focal spot plane disposed relative to said first reflective surface such that the first data beam will be imaged onto said storage media with each of said select locations on said first focal spot plane corresponding to one of said storage regions on said holographic storage media.

5. The holographic storage system of claim 4, wherein said second data beam deflector comprises:

a second focusing lens for receiving said second data beam after the second data image is superimposed thereon;

a second focal spot plane;

a second directing system for directing an output of said second focusing lens through select location on said second focal spot plane such that a focal point of said second focusing lens is substantially coplanar with said second focal spot plane for all positions of said second directing system; and said second focal spot plane disposed relative to said second reflective surface such that the second data beam will be imaged onto said storage media with each of said select locations on said second focal spot plane corresponding to one of said storage regions on said holographic storage media.

6. The holographic storage system of claim 1, wherein each of the stored data images in a given storage region is phase encoded such that a reference beam encoded with phase information corresponding to one of the stored data images and illuminating said given storage region at a predetermined angle, will generate a reconstructed data beam corresponding to the one of the stored data images, said first and second addressing devices comprising:

- respective first and second beam expanders for expanding said respective first and second laser beams to provide respective first and second expanded laser beams;
- respective first and second phase corrugators for imparting relative phase information to select portions of said respective first and second expanded laser beams to provide respective first and second phase encoded laser beams; and
- respective first and second deflecting systems for directing said respective first and second phase encoded laser beams as said respective first and second reference beams to reflect from said respective first and second reflective surfaces such that all portions of said respective first and second phase encoded laser beams intersect in respective first and second common points on the respective surface of said holographic storage media within said respective select storage region.

7. The holographic storage system of claim 6, wherein said respective first and second deflecting systems comprise:

- respective first and second focusing lenses for receiving said respective first and second phase encoded laser beams;
- respective first and second focal spot planes;
- respective first and second directing systems for directing an output of said respective first and second focusing lenses through a select location on said respective first and second focal spot planes such that a focal point of said respective first and second focusing lenses is substantially coplanar with said respective first and second focal spot planes for all positions of said respective first and second directing systems; and
- said respective first and second focal spot planes disposed relative to said respective first and second reflective surfaces such that said respective first and second focal spot planes will be imaged onto said storage media, and said select location on said respective first and second focal spot planes corresponds to one of said plurality of storage regions.

* * * * *

UNITED STATES PATENT AND TRADEMARK OFFICE
CERTIFICATE OF CORRECTION

PATENT NO. : 5,519,651
DATED : May 21, 1996
INVENTOR(S) : Stephen R. Redfield

It is certified that error appears in the above-indentified patent and that said Letters Patent is hereby corrected as shown below:

Column 4, line 2, replace "files" with --tiles--.

Column 8, line 41, replace "dam" with --data--.

Column 8, line 67, replace "dam" with --data--.

Column 12, Claim 2, line 4, replace "fail" with --fall--.

Column 12, Claim 3, line 15, insert --first-- following "with said".

Column 12, Claim 5, line 55, replace "location" with --locations--.

Signed and Sealed this

Seventeenth Day of December, 1996

Attest:

BRUCE LEHMAN

*Attesting Officer*    *Commissioner of Patents and Trademarks*